(12) United States Patent
Yang et al.

(10) Patent No.: US 7,635,603 B2
(45) Date of Patent: Dec. 22, 2009

(54) METHOD FOR MAKING RED-LIGHT EMITTING DIODE HAVING SILICON QUANTUM DOTS

(75) Inventors: Tsun-Neng Yang, Taoyuan (TW); Shan-Ming Lan, Taoyuan (TW)

(73) Assignee: Atomic Energy Council - Institute of Nuclear Energy Research, Taouyuan (TW)

(*) Notice: Subject to any disclaimer, the term of this patent is extended or adjusted under 35 U.S.C. 154(b) by 387 days.

(21) Appl. No.: 11/320,818

(22) Filed: Dec. 30, 2005

(65) Prior Publication Data

US 2007/0155030 A1 Jul. 5, 2007

(51) Int. Cl.
*H01L 21/00* (2006.01)

(52) U.S. Cl. .................. 438/22; 257/79; 257/E33.001; 977/950

(58) Field of Classification Search ............ 257/79, 257/E33.001; 438/22; 977/950
See application file for complete search history.

(56) References Cited

U.S. PATENT DOCUMENTS 5,536,857 A * 7/1996 Narula et al. ............... 556/10

2001/0041250 A1 * 11/2001 Werkhoven et al. ......... 428/212
2004/0106285 A1 * 6/2004 Zacharias .................. 438/689

OTHER PUBLICATIONS

Biteen et al. "Controlled passivation of luminescence Blue Shifts of isolated silicon nanocrystals," Mat. Res. Soc. Symp. Proc vol. 770 16.2.1, 2003.*
Boukherroub et al. "Ideal passivation of Luminescent Porous Silicon by thermal, Noncatalytic Reaction with alkenes and Aldehydes," Chem. Mater 13, 2002-2011, 2001.*
Rassel et al. "Electrical properties of $SiO_2$ films with embedded nanoparticles formed by $SiH_4/O_2$ chemical vapor deposition," J. Vac. Sci. Tech. B. 21(6) Dec. 2003.*
DiMaria et al. "High current imjection into $SiO_2$ from Si rich $SiO_2$ films and experimental applications," J. Appl. Phys. 51(5) May 1980.*
Hartstein et al. "Identification of electron traps in thermal silicon dioxide films," Appl. Phys. Lett. 38(8), Apr. 1981.*

* cited by examiner

*Primary Examiner*—Davienne Monbleau
*Assistant Examiner*—Matthew Reames

(57) ABSTRACT

The present invention provides a method for making a light emitting diode (LED) through a silica film growth, an annealing treatment and a surface treatment so that the LED whose spectrum covers the whole red-light zone of a white-light spectrum is obtained with stability, economy, environmental protection and high efficiency.

16 Claims, 7 Drawing Sheets

US 7,635,603 B2

METHOD FOR MAKING RED-LIGHT EMITTING DIODE HAVING SILICON QUANTUM DOTS

FIELD OF THE INVENTION

The present invention relates to a method for making a light emitting diode (LED); more particularly, relates to a method for making a red-light emitting diode (red-light LED) with a light emitting material of silicon (Si) base material having Si quantum dots as luminescence centers.

DESCRIPTION OF THE RELATED ARTS

In the early 1960s, a first red-light LED using a ternary alloy of GaAsP was successfully obtained. In 1980s, a LED using AlGaAs was successfully developed with enhanced light emitting efficiency. In 1990s, Hewlett-Packard Co. and Toshiba Co. further developed a LED with high efficiency using a quaternary alloy of AlGaInP. Yet, the manufactures of these ternary or even quaternary alloys are complex and the materials used include some rare or even poisonous heavy metals, such as Ga, As, P, etc.

The above prior arts use ternary or quaternary alloys to obtain red-light LEDs; but those ternary or quaternary alloys are rare or poisonous heavy metals at the same time. Hence, the prior arts do not fulfill users' requests on actual use.

SUMMARY OF THE INVENTION

The main purpose of the present invention is to obtain a red-light LED with economy, environmental protection and high efficiency, where luminescent strength is enhanced covering the whole red-light zone of a white-light spectrum; and low cost, harmlessness and compatibility to the manufacture of a semiconductor are obtained by using a Si base material as light emitting material.

To achieve the above purpose, the present invention is a method for making a red-light LED having Si quantum dots, where a Si-rich non-stoichiometric silica film covering on a substrate is grown through an atmosphere chemical vapor deposition; then, an annealing treatment to the substrate is processed to obtain a phase separation in the non-stoichiometric silica film so that a silica film having Si quantum dots as luminescence centers (Si QDs-SiO$_2$ film) is formed on the substrate; and, then, the Si QDs-SiO2 film is put into a vacuum stove for a surface treatment under a temperature between 700 and 1000 Celsius degrees in an environment of oxygen gas added with graphite. Accordingly, a novel method for making a red-light LED having Si quantum dots is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is a view showing a flow chart according to a preferred embodiment of the present invention;

DESCRIPTION OF THE PREFERRED EMBODIMENT

The following description of the preferred embodiment is provided to understand the features and the structures of the present invention.

Figure 1:
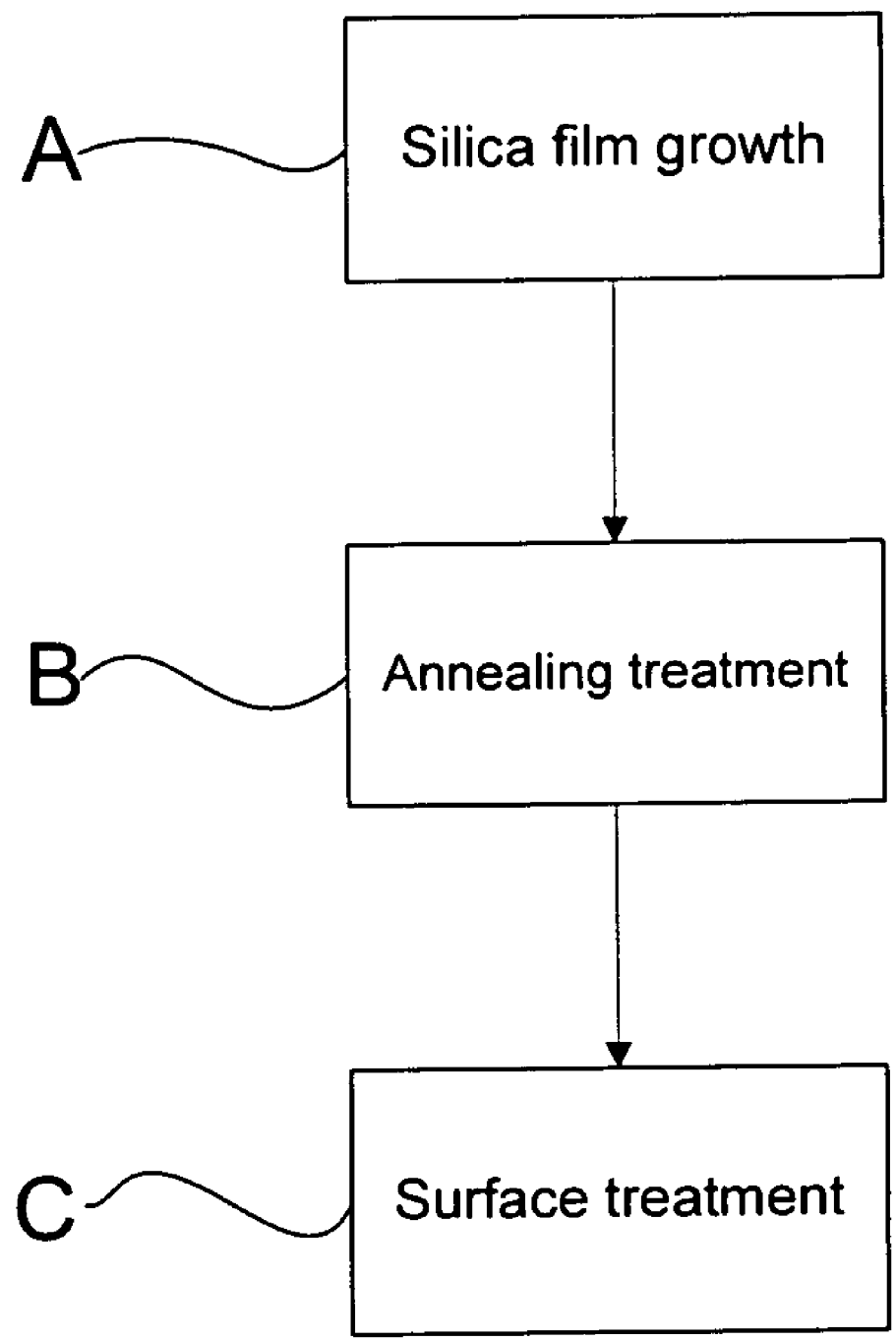

Please refer to FIG. 1, which is a view showing a flow chart according to a preferred embodiment of the present invention. As shown in the figure, the present invention is a method for making a red-light emitting diode (red-light LED) having silicon (Si) quantum dots, comprising the following steps:

Step (a): A non-stoichiometric silica film covering on a substrate is grown through an atmosphere chemical vapor deposition (APCVD).

Step (b): An annealing treatment to the substrate is processed to obtain a phase separation in the non-stoichiometric silica film so that a silica film having Si quantum dots (Si QDs-SiO$_2$ film) is formed on the substrate.

And, step (c): the Si QDs-SiO2 film is put into a vacuum stove for a surface treatment in an environment of oxygen gas (O2) added with a catalyst (e.g., a chemical reactant).

Figure 2:
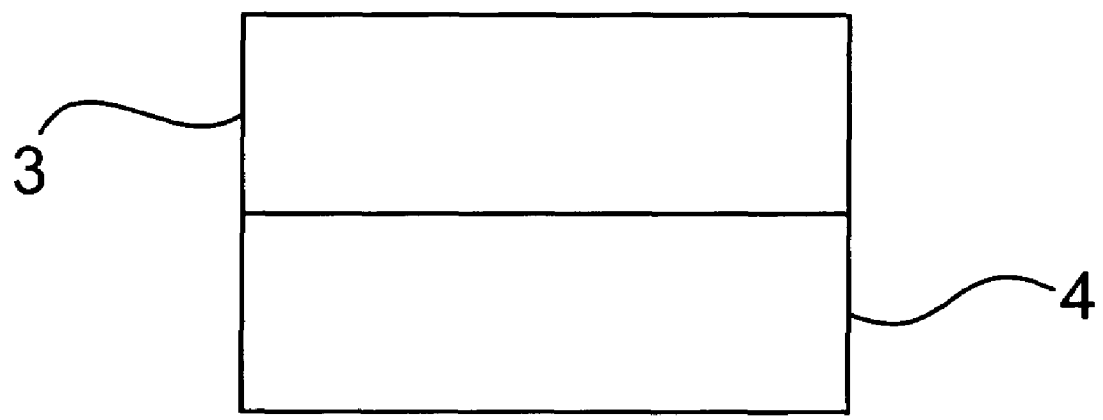
FIG. 2 is a structural view showing step (a) according to the preferred embodiment of the present invention.

Please refer to FIG. 2, which is a structural view showing step (a) according to the preferred embodiment of the present invention. As shown in the figure, the present invention contains a precursor of a mixture, which is obtained under a flow ratio, of dichlorosilane (SiH$_2$Cl$_2$) and laughing gas (nitrous oxide, N$_2$O), using a delivery gas of hydrogen. Thus, a non-stoichiometric silica film 3 is obtained through an APCVD to grow and cover on a substrate 4. Therein, the dichlorosilane can be substituted with silane and the laughing gas can be substituted with O$_2$; the flow ratio comprises a value between 0.1 and 10; the non-stoichiometric silica film 3 is made of a Si oxide (SiO$_x$) comprising a ratio of oxygen atoms to Si atoms smaller than 2 (x<2); and, the substrate 4 is made of Si, a glass or sapphire (Al$_2$O$_3$). When operating the APCVD, according to different precursors, a growth temperature for the non-stoichiometric silica film 3 is between 400 and 600° C. (Celsius degree); and the obtained non-stoichiometric silica film 3 rich in Si atoms (Si-rich) comprises a thickness between 0.1 and 10 μm.

Figure 3:
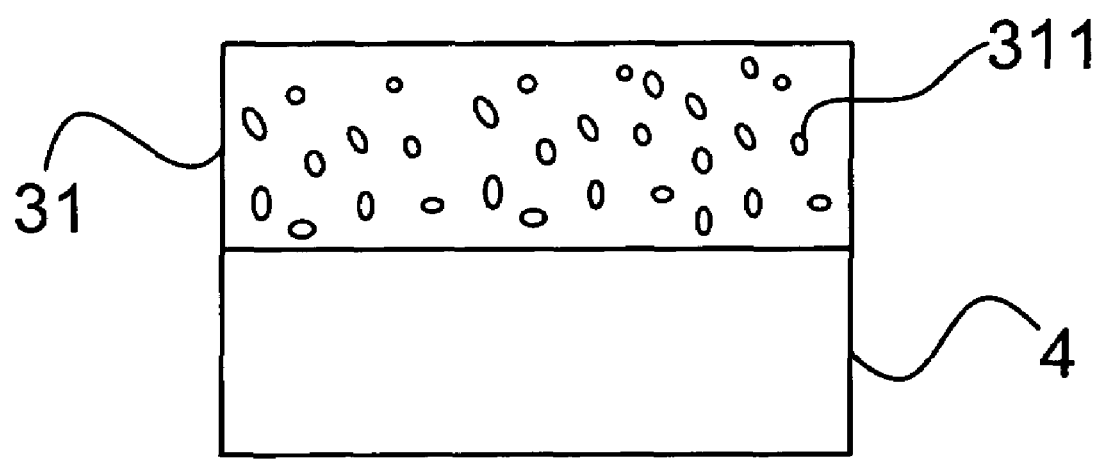
FIG. 3 is a structural view showing step (b) according to the preferred embodiment of the present invention.

Please refer to FIG. 3, which is a structural view showing step (b) according to the preferred embodiment of the present invention. As shown in the figure, a non-stoichiometric silica film 3 covering on a substrate 4 is processed with an annealing treatment in an environment of nitrogen gas, where a temperature for the annealing treatment is between 900 and 1200° C. After the annealing treatment is processed for 1 to 300 minutes, a phase separation of structural change is obtained in the non-stoichiometric silica film 3 to form an amorphous silica film 31. The Si atoms in the Si-rich non-stoichiometric silica film 3 are so changed to form Si quantum dots 311. Therein, the Si quantum dots 311 are evenly distributed in the amorphous silica film 31; the sizes of the Si quantum dots 311 are between 1 to 10 nm; the Si quantum dots 311 are luminescence centers of the red-light LED obtained; and, Si nanocrystals may be obtained instead after the annealing treatment.

Figure 4A:
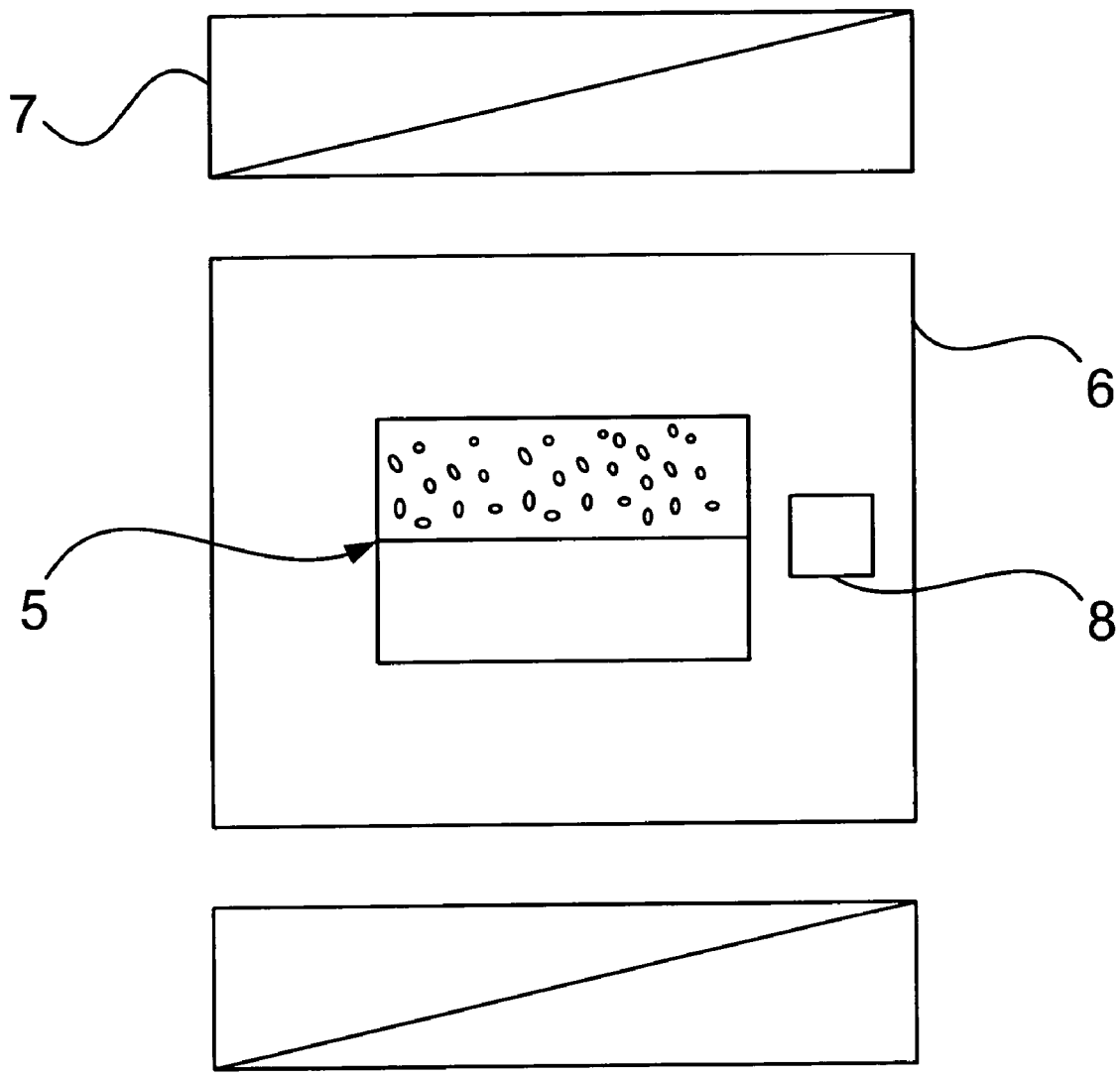
FIG. 4A and FIG. 4B are views showing two ways of surface treatment in step (C) according to the preferred embodiment of the present invention, where one is operated under an environment of oxygen gas and the other under carbon dioxide gas.
Figure 4B:
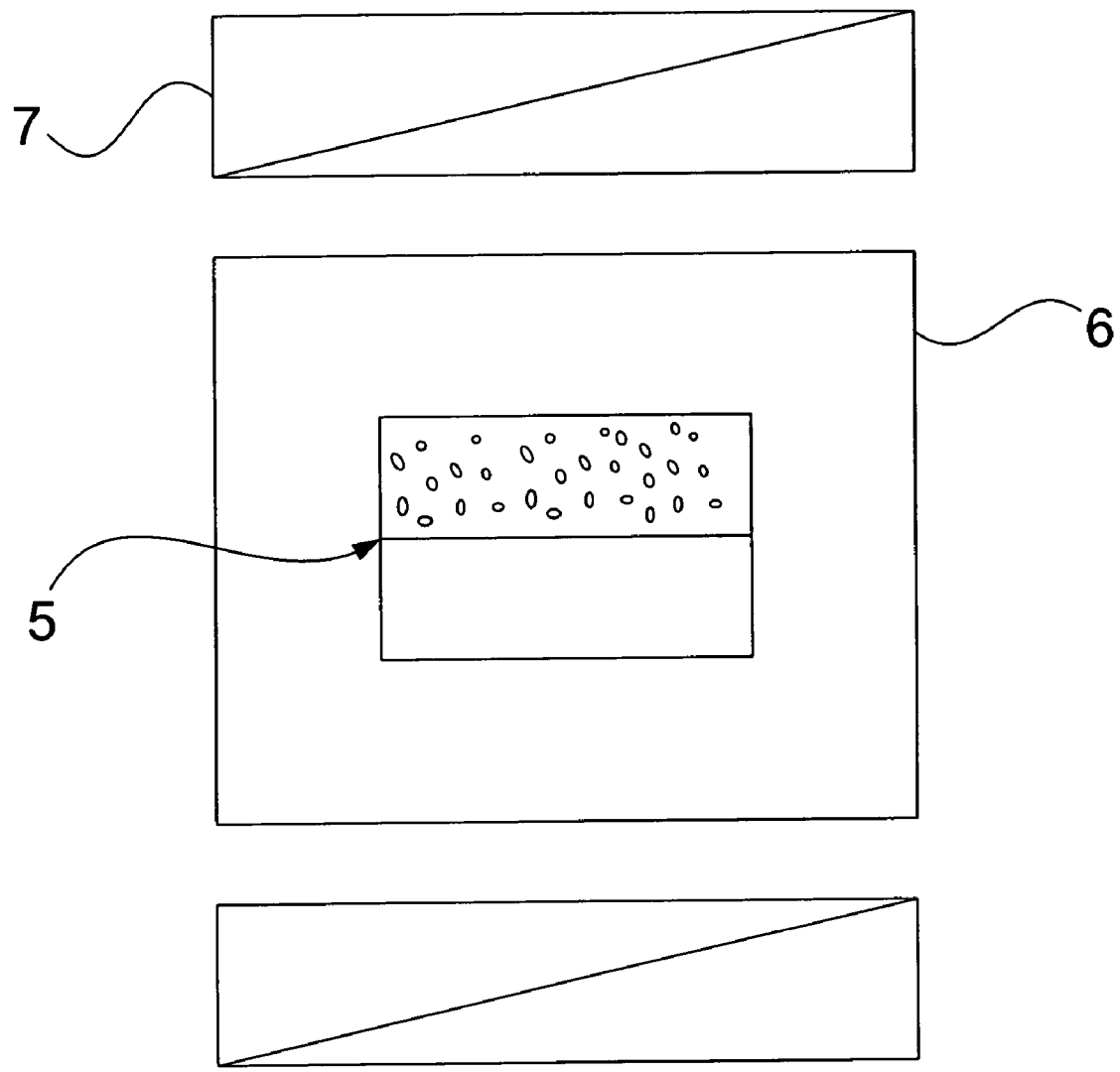

Please refer to FIG. 4A and FIG. 4B, which are views showing two ways of surface treatment in step (C) according to the preferred embodiment of the present invention, where one is operated under an environment of oxygen gas and the other under carbon dioxide gas. As shown in the figure, a substrate having Si QDs-SiO2 film 5 is put into a vacuum stove 6 to be clipped between a pair of heaters 7 for a surface treatment. The surface treatment is operated in an environment of oxygen gas or carbon dioxide gas, where a catalyst of graphite is added when an environment of oxygen gas is used. For obtaining stable Si quantum dots, the surfaces of the Si quantum dots are covered with a construction of a covalent bond, such as Si—C or S—O—C; by doing so, damages owing to oxidation or other chemical action to the constructions of the Si quantum dots as luminescence centers are prevented; furthermore, luminescent efficiency or luminescent strength are enhanced and the spectrum of the Si QDs-SiO2 film is shifted to red-light zone of a white-light spectrum. However, the surface treatment is operated under a high temperature between 700 and 1000° C.

Figure 5:
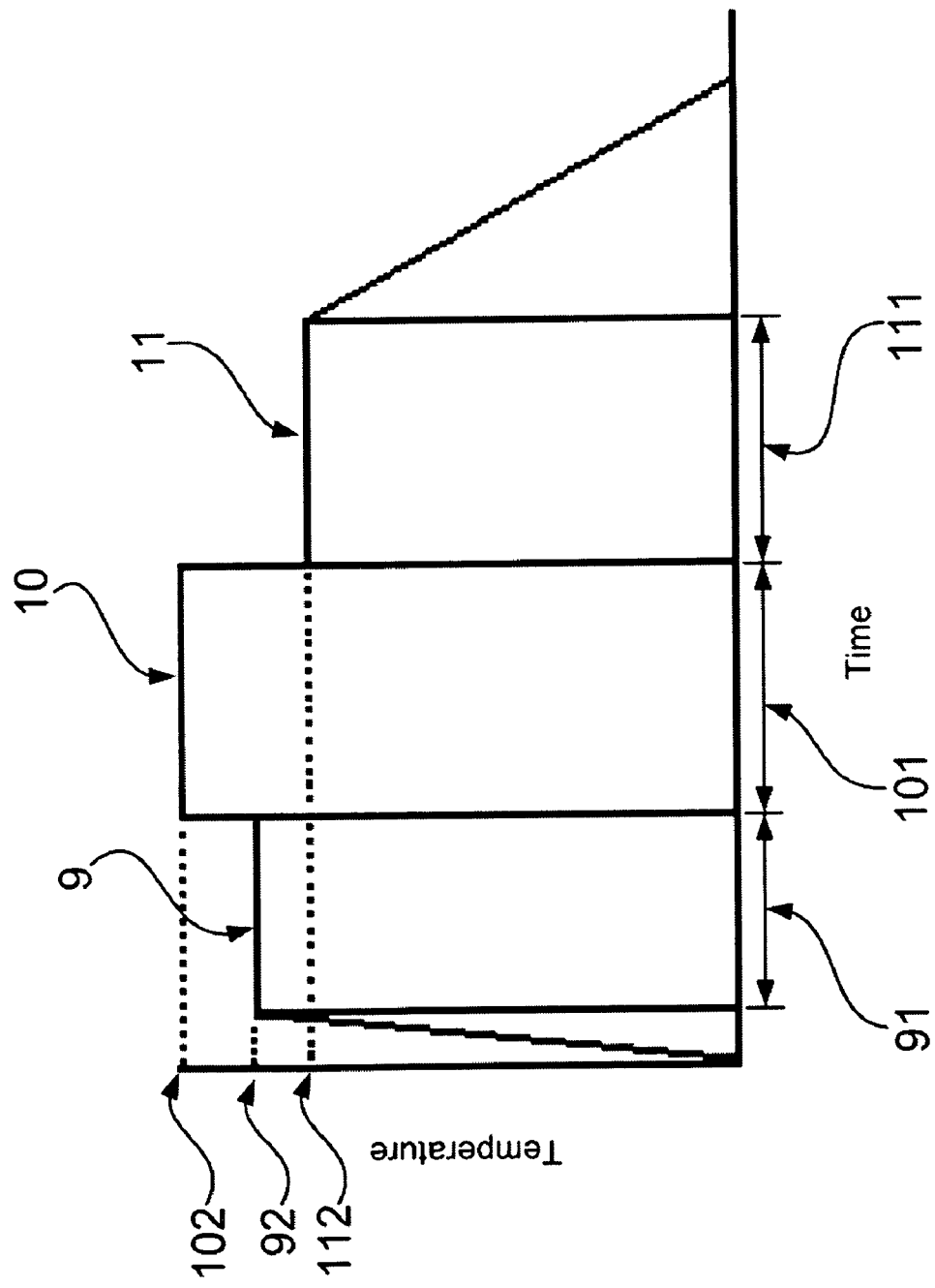
FIG. 5 is a view showing a relationship between temperature and time according to the preferred embodiment of the present invention.

Please refer to FIG. 5, which is a view showing a relationship between temperature and time according to the preferred embodiment of the present invention. As shown in the figure, the present invention comprises three steps of growing a silica film 9, processing an annealing treatment 10 and processing a surface treatment 11. The FIG. 5 shows the following items: a growth time 91 and a growth temperature 92 for a non-stoichiometric silica film; an annealing treatment time 101 and an annealing treatment temperature 102 for a Si QDs-SiO2 film; and a surface treatment time 111 and a surface treatment temperature 112.

Figure 6:
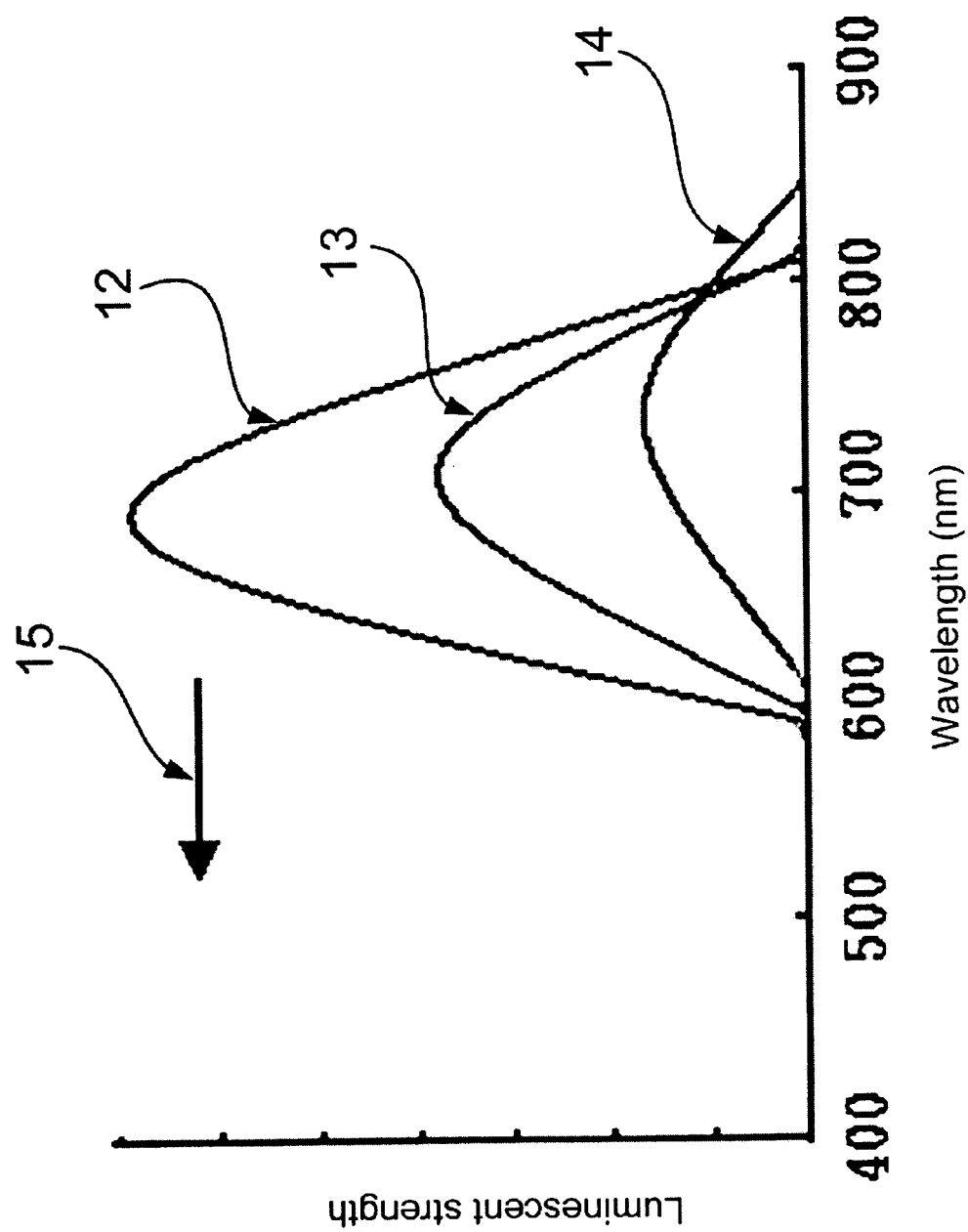
FIG. 6 is a view showing a photo luminescence spectrum obtained by an argon (Ar) laser shone on a substrate having Si QDs-SiO$_2$ film according to the preferred embodiment of the present invention.

Please refer to FIG. 6, which is a view showing a photoluminescence spectrum obtained by an argon (Ar) laser shone on a substrate having Si QDs-SiO2 film according to the preferred embodiment of the present invention. As shown in the figure, a first spectrum curve 12, a second spectrum curve 13 and a third spectrum curve 14 are included. The first spectrum curve 12 is a spectrum curve obtained by an Ar laser shone on a substrate having Si QDs-SiO$_2$ film according to the preferred embodiment of the present invention. The second spectrum curve 13 is a spectrum curve obtained by an Ar laser shone on a substrate having Si QDs-SiO$_2$ film before processing with a surface treatment according to the preferred embodiment of the present invention. The third spectrum curve 14 is a spectrum curve obtained by an Ar laser shone on a substrate having SiO$_2$ film before processing with an annealing treatment and a surface treatment according to the preferred embodiment of the present invention. By referring to the first spectrum curve 12, it is known that the Si QDs-SiO2 film made according to the present invention contain luminescent strength several times higher than a general one. And, the main peak of the first spectrum curve 12 has a blue shift so that the spectrum of the Si QDs-SiO2 film made according to the present invention can totally cover the whole red-light zone of a white-light spectrum, which is between 630 and 780 nm.

To sum up, the present invention is a method for making a red-light LED having Si quantum dots, where a low-cost red-light LED with economy, environmental protection and high efficiency is obtained to emit a light with luminescent strength covering the whole red-light zone of a white-light spectrum.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method for making a red-light emitting diode (red-light LED) having silicon (Si) quantum dots, comprising steps of:

(a) growing a non-stoichiometric silica film covering on a substrate through an atmosphere chemical vapor deposition (APCVD);
   (b) processing an annealing treatment to said substrate to obtain a phase separation in said non-stoichiometric silica film to obtain on said substrate a silica film having Si quantum dots (Si QDs-SiO$_2$ film); and
   (c) placing said substrate having said Si QDs-SiO$_2$ film into a vacuum stove and processing a surface treatment to said substrate in an environment of oxygen gas added with a chemical reactant,
   wherein, in step (a), said non-stoichiometric silica film is made of a Si oxide (SiO$_x$) having a ratio of oxygen atoms to Si atoms smaller than 2 (x<2), the formation of the entire SiO$_x$ film including only a single deposition step.

2. The method according to claim 1, wherein, in step (a), said APCVD has a precursor of a mixture of dichlorosilane (SiH$_2$Cl$_2$) and laughing gas (nitrous oxide); and
   wherein said mixture has a flow ratio of said dichlorosilane to said laughing gas.

3. The method according to claim 2, wherein said flow ratio has a value between 0.1 and 10.

4. The method according to claim 1, wherein, in step (a), said APCVD has a delivery gas of hydrogen.

5. The method according to claim 1, wherein, in step (a), said non-stoichiometric silica film grows under a growth temperature selected from a group consisting of a temperature between 800 and 1000° C. (Celsius degree) and a temperature between 400 and 600° C.

6. The method according to claim 1, wherein, in step (a), said non-stoichiometric silica film has a thickness between 0.1 to 10 microns.

7. The method according to claim 1, wherein, in step (a), said substrate is made of a material selected from a group consisting of Si, a glass, and sapphire (Al$_2$O$_3$).

8. The method according to claim 1, wherein, in step (b), said annealing treatment is operated under a temperature between 900 and 1200° C.

9. The method according to claim 1, wherein, in step (b), said annealing treatment is operated in an environment of nitrogen gas.

10. The method according to claim 1, wherein, in step (b), said annealing treatment is operated for a period of time between 1 and 300 minutes.

11. The method according to claim 1, wherein, in step (b), Si atoms in said non-stoichiometric silica film are formed into Si quantum dots during said annealing treatment.

12. The method according to claim 11, wherein said Si atoms are formed into Si nano-crystals.

13. The method according to claim 1, wherein said Si quantum dots have sizes between 1 and 10 nanometers.

14. The method according to claim 1, wherein, in step (b), said Si QDs-SiO$_2$ film is an amorphous silica film having Si quantum dots evenly distributed.

15. The method according to claim 1, wherein, in step (c), said chemical reactant is graphite.

16. The method according to claim 1, wherein, in step (c), said surface treatment is operated under a temperature between 700 and 1000° C.

* * * * *